(12) United States Patent
Probst

(10) Patent No.: US 6,884,968 B2
(45) Date of Patent: Apr. 26, 2005

(54) APPARATUS AND PROCESS FOR ANNEALING A MULTILAYER BODY, AND MULTILAYER BODY OF THIS TYPE

(75) Inventor: Volker Probst, Munich (DE)

(73) Assignee: Shell Solar GmbH, Munich (DE)

( * ) Notice: Subject to any disclaimer, the term of this patent is extended or adjusted under 35 U.S.C. 154(b) by 0 days.

(21) Appl. No.: 10/692,728

(22) Filed: Oct. 27, 2003

(65) Prior Publication Data

US 2004/0087172 A1 May 6, 2004

Related U.S. Application Data

(62) Division of application No. 10/048,419, filed as application No. PCT/DE00/02523 on Jul. 31, 2000, now Pat. No. 6,717,112.

(30) Foreign Application Priority Data

Jul. 30, 1999 (DE) .......................................... 199 36 081

(51) Int. Cl.[7] .................................................. F27B 5/14
(52) U.S. Cl. ........................ 219/390; 219/405; 219/411; 392/416; 392/418; 118/724; 118/725; 118/50.1
(58) Field of Search ................................ 219/390, 405, 219/411; 392/416, 418; 118/724, 725, 501

(56) References Cited

U.S. PATENT DOCUMENTS

| | | | |
|---|---|---|---|
| 4,976,996 A | | 12/1990 | Monokowski et al. |
| 5,314,538 A | | 5/1994 | Maeda et al. |
| 5,443,646 A | | 8/1995 | Yamada et al. |
| 5,578,503 A | | 11/1996 | Karg et al. |
| 5,614,133 A | | 3/1997 | Tanaka et al. |
| 5,861,609 A | * | 1/1999 | Kaltenbrunner et al. .... 219/390 |
| 5,926,742 A | | 7/1999 | Thakur et al. |
| 6,173,116 B1 | | 1/2001 | Roozeboom et al. |

FOREIGN PATENT DOCUMENTS

| | | |
|---|---|---|
| DE | 195 44 525 A1 | 6/1996 |
| DE | 197 11 702 C1 | 6/1998 |
| EP | 0 399 662 A2 | 11/1990 |
| EP | 0 662 247 B1 | 3/1999 |
| EP | 0 926 719 A2 | 6/1999 |
| JP | 57-183041 A | 11/1982 |
| JP | 07078830 A | 3/1995 |

OTHER PUBLICATIONS

Takayuki Watanabe et al., "Solar Cells Based on CuInS$_2$ Thin Films through Sulfurization of Precursors Prepared by Reactive Sputtering with H$_2$S Gas," *Jpn. J. Appl. Phys.*, V. 35, 1996, pp. 1681–1684.

F. Karg et al., "Novel Rapid–Thermal–Processing for CIS Thin–Film Solar Cells," *IEEE*, 1993, pp. 441–446.

J. Ermer et al., "Advances in Large Area CuInSe$_2$ Thin Film Modules," *IEEE*, 1990, pp. 595–599.

E. Niemi et al., "Small–and Large–Area CIGS Modules by Co–Evaporation," *IEEE*, 25th PVSC, 1996, pp. 801–804.

Nowshad Amin et al., "New Approaches on Thinner CdTe Thin–Film Solar Cells," *Thin Film Cells and Technologies*, 2nd World Conference on Photovoltaic Solar Energy Conversion, 1998, pp. 1081–1084.

* cited by examiner

*Primary Examiner*—Shawntina Fuqua
(74) *Attorney, Agent, or Firm*—Young & Thompson

(57) ABSTRACT

A process for annealing large-area multilayer bodies by supplying a quantity of energy at an annealing rate of at least 1° C./s. To suppress temperature inhomogeneities during the annealing, different partial quantities of the quantity of energy are supplied to the layers of the multilayer body with a local and temporal resolution. The multilayer body is annealed in a container which has a base and a cover made from glass-ceramic. The process is used to produce a thin-film solar module.

14 Claims, 5 Drawing Sheets

APPARATUS AND PROCESS FOR ANNEALING A MULTILAYER BODY, AND MULTILAYER BODY OF THIS TYPE

This application is a Divisional of U.S. patent application Ser. No. 10/048,419 filed on May 9, 2002 now U.S. Pat. No. 6,717,112. Application Ser. No. 10/048,419 is the national phase of PCT International Application No. PCT/DE00/02523 filed on Jul. 31, 2000 under 35 U.S.C. § 371. The entire contents of each of the above-identified applications are hereby incorporated by reference.

BACKGROUND OF THE INVENTION

The invention relates to an apparatus for annealing a multilayer body, which has a first layer and at least one second layer, through uptake of a quantity of energy by the multilayer body involving uptake of a first partial quantity of the quantity of energy by the first layer and uptake of a second partial quantity of the quantity of energy by the second layer, having at least one energy source. An apparatus of this type is known, for example, from EP 0 662 247 B1. As well as the apparatus, the invention also proposes a process for annealing a multilayer body and a multilayer body of this type.

A multilayer body is produced, for example, by applying a functional layer to a substrate layer. To ensure that the functional layer and/or the substrate layer has a desired physical (electrical, mechanical, etc.) and/or chemical property, under certain circumstances it is necessary for the multilayer body or the layer and/or the substrate layer to be processed. The processing comprises, for example, annealing of the multilayer body in the presence of a gas (process gas).

A multilayer body is, for example, a large-area thin-film solar cell, in which an electrode layer comprising molybdenum and a functional copper-indium-diselenide (CIS) semiconductor layer are applied to a substrate layer of glass. This thin-film solar cell is produced in a two-stage process according to EP 0 662 247 B1. In a first stage, the following elements are applied in layer form, in order, to the glass substrate layer:molybdenum, copper, indium and selenium. In a second stage, the multilayer body obtained in this way is annealed, leading to the formation of the copper-indium diselenide semiconductor layer.

For annealing, the multilayer-body is arranged in a closed container made from graphite. During the annealing, a defined partial pressure of gaseous selenium is formed in the interior of the container, the layers which have been applied to the glass being brought into contact with the gaseous selenium.

During the annealing, the multilayer body takes up a quantity of energy, each layer being supplied with a partial quantity of the quantity of energy. The annealing takes place, for example, at a heat-up rate of 10° C./s. The energy source for the quantity of energy which is used is a halogen lamp. The halogen lamp is used to irradiate the graphite container and thus to heat the container. An operation of this type is particularly efficient, since graphite which acts, as it were, as a "black body radiator", has a high absorption capacity for electromagnetic radiation, in particular for radiation in the spectral region of the halogen lamp. The quantity of energy absorbed by the graphite is fed to the multilayer body by heat radiation and/or heat conduction. The container therefore functions as a secondary energy source or as an energy transmitter.

Graphite has a high emission capacity and a high thermal conductivity. When the multilayer body is resting on a base of the container, the quantity of energy is supplied to an underside of the multilayer body substantially by heat conduction. A quantity of energy is fed to an upper side of the multilayer body by heat radiation.

On account of an asymmetric layer structure of the multilayer body and/or a different quantity of energy being supplied to the top side and the underside of the multilayer body, a high heating rate may lead to inhomogeneous, i.e. non-uniform annealing of the layers of the multilayer body. Temperature inhomogeneity may form in the thickness direction of the multilayer body and, given a coefficient of thermal expansion of a material of a layer which is not zero, may lead to mechanical stress within the layer and/or the multilayer body. This mechanical stress may cause the layer and/or the multilayer body to crack or fracture. The mechanical stress may also lead to deformation (distortion) of the multilayer body. In the case of a substrate layer made from glass, the deformation is generally transient, i.e. disappears again after the annealing. The deformation may also be permanent. In this case, the deformation does not disappear again. This is the case if a softening point of the substrate layer (e.g. of glass) is exceeded during the annealing and an (internal) mechanical stress and/or an external force becomes active.

The larger the area of the multilayer body and the higher the annealing rate (heating rate, cooling rate), the more difficult it becomes to deliberately influence temperature inhomogeneities in the multilayer body during the annealing of the multilayer body and the greater the likelihood of an undesirable mechanical stress occurring.

It is an object of the invention to demonstrate how temperature homogeneity or temperature inhomogeneity can be deliberately influenced during the annealing of a large-area multilayer body with a high annealing rate.

SUMMARY OF THE INVENTION

To achieve the object, the invention proposes an apparatus for annealing a multilayer body, which has a first layer and at least one second layer, through uptake of a quantity of energy by the multilayer body involving uptake of a first partial quantity of the quantity of energy by the first layer and uptake of a second partial quantity of the quantity of energy by the second layer, having at least one energy source for the quantity of energy. The apparatus is characterized in that a first energy source and at least one second energy source are present, at least one of the energy sources emits a defined electromagnetic radiation with a radiation field, at least one of the layers has a defined absorption for the electromagnetic radiation, the first layer can be arranged between the first energy source and the second layer, and the second layer can be arranged between the second energy source and the first layer, in such a manner that the layer which absorbs the electromagnetic radiation is situated in the radiation field, and at least one transparency body, which has a defined transmission and a defined absorption with respect to the electromagnetic radiation is arranged in the radiation field between the energy source with the radiation field and the layer which absorbs the electromagnetic radiation.

The idea of the invention consists in individually heating the layers of the multilayer body, i.e. of deliberately controlling, regulating and/or presetting the partial quantity of the quantity of energy which is taken up by a layer. By way of example, a quantity of energy is determined with the aid of a control circuit during the annealing (see below). It is also conceivable for the energy sources to be preset (e.g.

energy density, nature of the energy, etc.), without the need for an additional control circuit. The invention allows individual heating of the layers of the multilayer body even at very high heating rates of 1° C./s up to, for example, 50° C./s and above. The individual heating makes it possible to minimize mechanical stress and deformation of the multilayer body which may result under certain circumstances during the annealing.

The basis for this is the transparency body, which is optically semitransparent. The transmission, which lies, for example, at a defined wavelength between 0.1 and 0.9, causes the electromagnetic radiation described above to pass through the transparency body onto a layer. The layer can take up a corresponding quantity of energy or partial quantity of the quantity of energy which is emitted directly from the energy source.

However, the transparency body also has a certain absorption for the electromagnetic radiation. The energy which is thereby taken up may be emitted to a surrounding area in the form of heat radiation and/or heat conduction. In a particular configuration, the apparatus for annealing a multilayer body has a transparency body which radiates and/or conducts heat in the direction of the multilayer body through the absorption of the electromagnetic radiation. In this way, it is possible to anneal a layer by heat radiation and/or heat conduction.

It is also conceivable for a first layer of the multilayer body, which transmits the heat radiation, to be annealed substantially only by the heat conduction, while a second layer of the same multilayer body is annealed substantially by the heat radiation from the same transparency body. A first layer which exhibits corresponding transmission is, for example, a layer comprising glass. If electromagnetic radiation from an energy source and/or a transparency body comes into contact with the glass body, a small proportion of the radiation (approximately 4%) is reflected. Most of the radiation (>90%) passes through the glass more or less without obstacle and then impinges on a second layer of the multilayer body, where this radiation can be absorbed and can lead to a quantity of energy being taken up by this second layer. The glass layer cannot be annealed sufficiently quickly by radiation or heat radiation at a very high heating rate. By contrast, relatively quick annealing can be achieved by heat conduction if the transparency body is able to take up a partial quantity of the quantity of energy and transmit it to the glass layer.

The situation in which the transparency body itself is a layer of the multilayer body is also conceivable. The transparency body can take up a partial quantity of the quantity of energy through absorption of part of the electromagnetic radiation and, by transmission, can pass on a further partial quantity of the quantity of energy in order for this partial quantity to be taken up by a further layer.

In a particular configuration, a multilayer body in which one layer functions as a substrate layer for at least one further layer is used in the process. The multilayer body has in particular an asymmetric layer sequence. By way of example, the multilayer body comprises a substrate layer which is coated on one side. Individual layers of the multilayer body may also be arranged next to one another.

In a particular configuration, one layer of the multilayer body ncludes a material which is selected from the group consisting of glass, glass-ceramic, ceramic, metal and/or plastic. A suitable plastic is in particular heat-resistant plastic, such as Teflon. One layer is, for example, a metal foil. The metal foil may also function as a substrate layer.

The partial quantity of the quantity of energy which is taken up by a layer is dependent, for example, on an absorption, emission and/or reflection property of the layer. However, it is also dependent on the nature of the energy source and on the way in which the quantity of energy is transmitted to the multilayer body or to a layer of the multilayer body. The annealing of the multilayer body or of a layer takes place, for example, with the aid of an energy source for thermal energy. The layer may be supplied with the thermal energy directly. Heat radiation, heat conduction and/or convection are suitable means for achieving this. In the case of heat radiation, the energy source itself may be a source of heat radiation. The heat radiation is, for example, electromagnetic radiation in the wavelength range between 0.7 and 4.5 $\mu$m (infrared light). The corresponding layer is arranged in the radiation field of the energy source. The electromagnetic radiation from the energy source impinges on the layer, which at least partially absorbs the electromagnetic radiation.

However, it is also possible for a layer to be supplied with any desired energy, which is converted into thermal energy in the layer. By way of example, a layer is irradiated with high-energy UV light, which the layer absorbs. Absorption of a high-energy light quantum causes a molecule of the layer or the entire layer to become electronically excited. Energy which is taken up in the process can be converted into thermal energy.

As well as heat radiation and heat conduction, it is also possible for a layer or the entire body to be annealed through convection. In this case, a gas with a defined energy is guided past the layer, the gas releasing the energy to the layer. The gas which is guided past may simultaneously function as process gas.

Moreover, a layer can also be cooled by heat conduction and/or convection. In this case, negative thermal energy is supplied to the layer. In this way, it is also possible to control the quantities of energy or the partial quantities of the quantities of energy and, for example, to additionally influence the mechanical-stresses in the multilayer body.

In a particular configuration, there is an energy transmitter for transmitting the quantity of energy to the multilayer body.

The energy transmitter functions as a secondary energy source. The energy transmitter absorbs, by way of example, electromagnetic radiation from a primary energy source, e.g. a halogen lamp, from a higher energy area and converts this electromagnetic radiation into heat radiation which is absorbed by the layer.

The indirect and/or direct vicinity of the multilayer body can function as energy transmitter during the annealing. It is conceivable for an energy transmitter to be arranged with the multilayer body which is to be annealed in an interior space of a container. The energy transmitter may also be arranged outside the container, for example on a wall of the container or at a distance from the container. It is conceivable for the energy transmitter to be a coating of the container. By way of example, the energy transmitter may be a graphite film. It is even possible for the container itself to act as an energy transmitter. A function of this type is provided, for example, in the case of a container made from graphite. Finally, the transparency body is nothing other than an energy transmitter. Likewise, a gas, when transmitting energy through convection, acts as an energy transmitter.

A quantity of energy which is taken up by the multilayer body may differ not only from layer to layer but also within a layer. By way of example, during the annealing an edge effect occurs in the multilayer body or in a layer of a multilayer body. An edge region of the layer is at a different temperature from an inner region of the layer. During the annealing, a lateral temperature gradient is established. This takes place, for example, if a radiation field of the energy source is inhomogeneous. In this case, an energy density of the radiation field over a surface through which the radiation is radiated is not identical everywhere. Lateral temperature inhomogeneity may also be established when the radiation field is homogeneous, if a greater quantity of energy per unit volume is absorbed at the edge of a layer, on account of the larger absorbing area per unit volume. To compensate for the temperature gradient, it is possible, for example, to use an energy source which comprises a multiplicity of subunits. Each subunit may be actuated separately, and in this way each quantity of energy supplied from a subunit to a layer can be set separately. An example of an energy source of this type is an array or matrix of individual heater elements. An example of a heater element is a halogen lamp. The array or matrix can also be used to produce a lateral temperature gradient in the layer. In this way, it would be possible, for example, to deliberately produce permanent or transient deformation of the layer body. An array or matrix is highly advantageous in particular for the annealing of a multilayer body in which layers lie next to one another.

In connection with the energy source, it is advantageous if the energy source or sources operate continuously. However, it is also conceivable for the energy sources to make the quantity of energy or the partial quantities of the quantity of energy available to the layers in a cyclical or pulsed mode. An energy source of this type is, for example, an energy source with pulsed electromagnetic radiation. In this way, a quantity of energy can be supplied to the layers at the same time or in a temporal sequence (e.g. alternately).

The following properties of the energy source for electromagnetic radiation are particularly advantageous:

The energy source has a homogeneous radiation field. A spectral intensity distribution of the energy source partially overlaps a spectral absorption of the layer, of the transparency body and of any container which may be present (cf. below).

In the presence of a process gas, the energy source is resistant to and/or protected from corrosion.

The energy source has a high energy density, which is sufficient to enable a mass of the multilayer body (and if appropriate that of a container) to be heated with a heating rate of over 1° C./s.

In a particular configuration, the transparency body of the apparatus has at least one spacer, onto which the multilayer body can be placed in order for a laterally homogeneous quantity of energy to be taken up by the multilayer body. By way of example, the layer by means of which the multilayer body rests on the transparency body or the spacer is annealed primarily by homogeneous thermal radiation. In this form, the spacer preferably includes a material which has a low level of absorption for the electromagnetic radiation. A spacer projects beyond a surface of the transparency body, for example by a few $\mu$m to mm.

The layer resting on the spacers may also be annealed primarily through heat conduction. For this purpose, the spacers have, for example, a thermal conductivity which is required in order to achieve the corresponding annealing rate. It is also conceivable for the spacer, in order to transmit energy by heat conduction, to have a high absorption in respect of electromagnetic radiation from an energy source, the electromagnetic radiation being efficiently converted into thermal energy.

In particular, the transparency body has a multiplicity of spacers of this type. With a multiplicity of spacers which are arranged evenly, in contact, between the layer of the multilayer body and the transparency body, it is additionally possible to achieve homogenization of the lateral temperature distribution.

In a particular configuration, the transparency body and/or the spacer includes a material which is selected from the group consisting of glass and/or glass-ceramic. Glass-ceramic has various advantages:

It can be used for annealing within a wide temperature range from, for example, 0° C. to, for example, 700° C. Glass-ceramic has, by way of example, a softening point which lies above the temperature range.

It has a very low coefficient of thermal expansion. It is able to withstand thermal shocks and is free of distortion within the abovementioned temperature range for the annealing.

It is chemically inert with respect to a wide range of chemicals and is relatively impermeable to these chemicals. A chemical of this type is, for example, the process gas to which a layer and/or the entire multilayer body is exposed during the annealing.

It is optically semitransparent in the spectral region of numerous energy sources for electromagnetic radiation, in particular in a wavelength region in which a radiation density from the energy sources is high. A radiation source of this type is, for example, a halogen lamp with a high radiation density between 0.1 and 4.5 $\mu$m.

Glass, in particular quartz glass, are also conceivable for use as materials for the transparency body. The advantage of glass is that it can be used at high temperatures of up to 1200° C. These materials have a high transmission and low absorption in the spectral region of an energy source in the form of a halogen lamp. The light passes through this transparency body substantially without obstacle and passes to a layer with a corresponding absorption for the electromagnetic radiation, the layer taking up a quantity of energy and being heated. The transparency body is scarcely heated by the radiation.

In one process application, it is possible for material of the heated layer to be evaporated and deposited on a relatively cold surface of the transparency body. To prevent this, it is possible to ensure that the transparency body is heated to a required temperature during the annealing. This is achieved by transferring a quantity of energy to the transparency body by heat conduction and/or convection. Electromagnetic radiation which the transparency body absorbs is also conceivable. It is conceivable for the transparency body to have a coating which absorbs a certain proportion of the electromagnetic radiation. The energy which is taken up as a result can be transmitted to the transparency body made from glass or quartz glass. In this form, the transparency body, comprising the glass body with the coating, is optically semi-transparent and can be used to transmit energy to the multilayer body both by heat radiation and by heat conduction.

In a particular configuration of the invention, at least one layer can be brought into contact with a process gas. It is also conceivable for the entire multilayer body to be exposed to the process gas. During the annealing, the process gas acts on the layer or on individual layers or on the entire multilayer body and is involved in the change in the physical and chemical properties of the multilayer body. An example of a suitable process gas is an inert gas (molecular nitrogen or noble gas). The process gas does not react with a material of the layer. However, a process gas which does react with a material of the layer is also conceivable. The functional layer forms under the action of the process gas. By way of example, the process gas has an oxidizing or reducing action with respect to a material of the layer. Possible process gases for this purpose are oxygen, chlorine, hydrogen, elemental selenium, sulfur or a hydride. It may also be an etching process gas, such as HCl or to like. Further examples of the process gas are $H_2S$ and $H_2Se$, which are used for the production of a thin-film solar cell (cf. below). Finally, all gases or gas mixtures which react with a material of a layer in a suitable way are conceivable.

It is advantageous if the layer is exposed to a defined process-gas atmosphere. The defined process-gas atmosphere comprises, for example, a partial pressure of the process gas or gases during the annealing. By way of example, it is also conceivable for a layer or the multilayer body to be in contact with vacuum in order for annealing to be carried out.

A defined process-gas atmosphere can be achieved, for example, by guiding the process gas past the layer at a defined velocity. During the annealing, a process gas with various partial pressures can act on the layer. It is also conceivable for various process gases to be in contact with the layer of the layer body in succession.

Preferably, at least the layer which is in contact with the process gas is enclosed. This is achieved, for example, by sheathing the layer, it being possible for the sheathing to be secured to the substrate layer. The sheathing is filled with the process gas before or during the annealing. The process gas is in the process concentrated on a surface of the layer whose properties are to be influenced by the process gas. In this way, it is possible to prevent a surrounding area from being contaminated by the process gas. This is particularly important when using a corrosive and/or toxic process gas. Moreover, it is possible to operate with a stoichiometric quantity of process gas which is required for conversion of the layer. There is no unnecessary consumption of process gas.

In a particular configuration of the invention, there is a container for holding the multilayer body during the annealing. The transparency body is in particular a wall of the container. The container has the advantage that it automatically forms the sheathing of the layer or of the entire multilayer body. The sheathing does not need to be secured to the multilayer body. In the case of a closeable container, the process-gas atmosphere can be set specifically and easily. In particular, for this purpose the container has at least one gas opening for evacuation of the container and/or filling of the container with the process gas. In a particular embodiment, the gas opening is produced by an automatically closeable valve. The process-gas atmosphere can be set actively. The gas opening can also be used in order to fill the container with any desired gas, for example a purge gas. The process-gas atmosphere may also be set or adjusted during the annealing.

To specifically set the process-gas atmosphere, however, it is also possible for the container to have a sufficiently large volume for the process gas required during the annealing. If the annealing requires a homogeneous and reproducible distribution of the process gas over a layer, it is also possible to specifically establish a gas discharge from the container. This may be required, for example, if annealing is carried out at a very high heating rate. In this case, the process gas expands. If the container is unable to withstand the gas pressure which occurs as a result, the container will be deformed or even destroyed. However, deformation should be prevented, for example, if the multilayer body is resting on the base of the container. As described above, deformation of the container leads to lateral temperature inhomogeneity in the multilayer body, with the corresponding consequences.

Moreover, the container may be means for conveying the multilayer body during the annealing. The container has the advantage that, during the annealing, it is not possible, for example, to rule out the possibility of a layer (substrate layer) of glass breaking. In the event of a substrate of this type breaking, the broken material can easily be removed from an installation for annealing the multilayer body. This contributes to stabilizing the process in the annealing installation.

In a particular configuration, the wall of the container which includes the transparency body is a cover and/or a base of the container. By way of example, one layer of the multilayer body rests directly on the transparency body of the base. As described above, the transparency body may have spacers. The cover likewise includes the transparency body which, by way of example, is not in contact with the multilayer body or a layer of the multilayer body. In this way, the layer of the multilayer body which rests on the base can be heated by heat conduction, and the layer which faces the cover can be heated by heat radiation. The layer facing the cover can easily be exposed to a process gas.

However, the cover of the container can also be characterized by high absorption of the electromagnetic radiation which is emitted by an energy source.

In a further configuration, the base and/or the cover of the container is formed by in each case at least one multilayer body. In this case, the layer of the multilayer body which, for example, is to come into contact with a process gas is directed into an interior of the container. This solution is possible if the multilayer body or the layers of the multilayer body have a low coefficient of thermal expansion and/or the annealing rate is low. In the case of a high annealing rate, the multiplayer body advantageously has a substrate layer with a high coefficient of thermal conductivity. The substrate layer is directed outward. By way of example, in this case the substrate layer is a transparency body as described above.

With the container, the apparatus is suitable in particular for carrying out the annealing in an in-line process with various process stages which are carried out in different process zones.

In the in-line process, the container can be conveyed either continuously or discontinuously. In the case of the continuous in-line process, the material being processed or the processing container is moved through the processing installation throughout the entire passage. The discontinuous or indexing mode of the in-line process is characterized in that the processing box or the material being processed is moving only during its transfer from one process zone into the next, remaining in the process stage until the sub-process has been concluded. In this case, it is advantageous for the transfer time to be as short as possible when compared to the residence time. The material or box is then conveyed onward into the next process zone, followed by a further residence time, etc. In the case of in-line installations which are designed for indexing operation, it is advantageous for each process zone to be at least of the size of a processing vessel, so that the homogeneity of a process zone (for example the temperature) can be transferred to the material being processed. In a further configuration, all the processing zones which are fed by indexing operation have the same dimensions, as seen in the conveying direction. Consequently, simple conveyor mechanisms, such as a conveyor chain, a conveyor belt or pusher conveying, can be used to simultaneously load and unload, in indexing mode, not just one process zone, but rather all adjacent process zones.

By way of example, the multilayer body is placed into the container. The container is used to transport the multilayer body from process stage to process stage or from process zone to process zone. Each process stage, for example heating, cooling, evacuation or filling of the container, can be carried out in a dedicated process zone. In a first process stage, the container is filled with, for example, a process gas. The container can be introduced into a chamber which is provided specifically for that purpose, where it can be evacuated, filled with a corresponding process gas and closed. A separate inlet and outlet (gas opening) in the container for purging or filling the container with the process gas is possible. This gas opening can be connected to a coupling unit and positioning unit in order for the processing box to be filled with gas or evacuated. The coupling unit is used, for example, to connect the container, in an in-line process, for example in indexing mode, in order for a process stage to be carried out at a specific location (process zone), to a corresponding unit (e.g. vacuum pump, gas cylinder) in such a manner that the container can be filled with the corresponding gas or emptied.

In a particular configuration, the container has a coupling unit allowing the container to be arranged in a process zone. With the aid of the coupling unit, it is possible to hold or position the container in a process zone. For this purpose, by way of example, the process zone likewise has a coupling unit. The coupling unit is used, for example, to hold the container at a specific location (process zone) in an in-line process for carrying out a process stage and to connect it to a corresponding unit (e.g. vacuum pump, gas cylinder), in such a manner that the container can be filled with the corresponding gas or the container can be emptied. The coupling unit of the container and the coupling unit of the process zone function, for example, according to the key/hole principle.

It is also conceivable for the container to be conveyed from process zone to process zone with the aid of the coupling unit.

The following process sequence is conceivable: in a first process stage, the container is filled, for example, with a process gas. The container can be introduced into a chamber which is present specifically for this purpose, where it can be evacuated, filled with a corresponding process gas and closed. A separate inlet and outlet (gas opening) of the container for purging and filling the container with the process gas is also possible. In particular, the gas opening of the container has a coupling unit for coupling the container to a coupling unit of a process zone.

This gas opening can be used as a coupling unit and/or positioning unit. The annealing takes place in a second process stage. For this purpose, the container is conveyed out of the chamber into a heating zone. After the annealing has ended, the multilayer body is conveyed out of the heating zones into the cooling zones in order for a further process stage to be carried out.

The conveying in the in-line process takes place, for example, by passing a multiplicity of containers containing multilayer bodies through the in-line installation in the form of a train. The entire train is set in motion by the pushing action of one container. The containers are moved simultaneously. This type of conveying is known as a "pusher drive". In this case, the conveying advantageously takes place in "indexing mode".

In a particular configuration, the apparatus is arranged in a processing chamber which is selected from the group consisting of a vacuum chamber, an atmospheric chamber and/or a high-pressure chamber. An entire in-line installation may be integrated within the processing chamber. By way of example, a heating or cooling zone is accessible to the container containing the multilayer body through a lock or is separated from a further process zone in the processing chamber by such a lock. In particular, it is conceivable for there to be a plurality of processing chambers, for example a heating zone with a single-walled processing chamber, a cooling zone with a double-walled chamber which is water-cooled. The container is used to transport the multilayer body from processing chamber to processing chamber.

In a particular configuration, the transparency body and/or the energy transmitter and/or the container and/or the processing chamber includes a material which is inert with respect to a process gas. Moreover, it is advantageous for an entire annealing process area to be inert with respect to the process gas used. The process area also includes, for example, the energy source (primary energy source).

The material is selected according to the process gas. By way of example, glass, glass-ceramic and ceramic are conceivable. It is also possible to use a fiber-reinforced material, such as carbon-fiber-reinforced graphite. A material such as SiC, which has a high coefficient of thermal conductivity, is also conceivable. The container and/or the processing chamber may be completely or partially made up of a metal or an alloy. A plastic which is unaffected up to a defined temperature is also possible.

In addition to being chemically inert with respect to the process gas, the following properties are also advantageous for the material of the container:

The material of the container is free from distortion under the annealing conditions. Moreover, it is able to withstand thermal shocks. This is the case in particular if it has a low coefficient of thermal expansion.

The thermal softening point of the material of the container is above a maximum temperature reached during the annealing.

The container has a low or defined permeability with respect to a process gas.

In a particular configuration, there is a device for detecting a measurement of at least one physical parameter of the apparatus, which is dependent on the annealing, for controlling the first and second partial quantities of the quantity of energy.

A possible parameter is an absorption, transmission and/or reflection property of a layer. The measurement of the parameter is the value of the parameter. By way of example, a wavelength of an absorption maximum may be dependent on the temperature. In this case, the measurement of the parameter would be the corresponding wavelength.

In particular, the parameter is a temperature of the multilayer body. The measurement is in this case a value of the temperature. Detection of the temperature of a layer of the multilayer body, of the transparency body and/or of the container or of a wall of the container is also conceivable. During the annealing, it is always possible for at least one parameter of the multilayer body and/or of a layer to be detected. By way of example, the partial quantity of the quantity of energy which is taken up by the layer is increased or reduced on the basis of the detected temperature of a layer. In this way, temperature inhomogeneity or a temperature gradient In the thickness direction of the multilayer body can be avoided. However, if necessary, this temperature homogeneity can also be increased.

By way of example, the device for detecting the temperature is a pyrometer which is directed onto the layer. By way of example, the pyrometer detects the thermal radiation which is emitted by the layer. The temperature of the layer can be established on the basis of the thermal radiation. A temperature detector which is connected to the layer and the temperature of which is controlled by heat conduction is also conceivable.

It is also conceivable for the temperature of the layer or of the multilayer body to be measured not directly but rather indirectly. By way of example, a pyrometer is directed onto the container in which the multilayer body is being annealed. The temperature of the container may be influenced by the temperature of the multilayer body. The temperature of the layer of the multilayer body can be worked out from the temperature of the container. The quantity of energy or the partial quantity of the quantity of energy is controlled on the basis of the measured container temperature. For this purpose, for example prior to the annealing, a type of "calibration measurement" is to be carried out, representing a relationship between the measured temperature of the container and the actual temperature of the layer or of the layer body. The "calibration measurement" indicates a desired value for the temperature. The actual value is detected. A comparison between desired value and actual value supplies a control variable for controlling the quantities of energy.

The detection (and also the control of the partial quantities of the quantity of energy) takes place in particular with a local resolution in the thickness direction of the multilayer body and with a temporal resolution within the time frame of the annealing. By way of example, the multilayer body is heated at an annealing rate of 25° C./s. Then, both the detection and the control of the partial quantities of the quantity of energy would take place so quickly that a temperature difference between the layers of the multilayer body during annealing remains, for example, below a prescribed maximum.

The temperature inhomogeneity in the thickness direction may, in combination with a transient deformation of the multilayer body, also lead to a lateral temperature inhomogeneity in the multilayer body. Lateral means, for example, within a layer of the multilayer body perpendicular to the thickness direction. As described in the introduction, the multilayer body, during the annealing, rests, for example, on a base made from graphite. The supply or uptake of the quantity of energy by the layer of the multilayer body which rests on the base takes place through heat conduction. Transient deformation of the multilayer body in the form of bending of the multilayer body may occur as a result of temperature inhomogeneity in the thickness direction. In the process, the contact between the multilayer body and the base of the container which is required for the heat conduction is partially detached. This leads to a lateral temperature inhomogeneity of the resting layer or of the multilayer body. Therefore, it is particularly advantageous if there is a local resolution not only in the thickness direction but also laterally, in order for the parameter to be detected (and the quantities of energy to be controlled).

In one particular configuration, the parameter is a deformation of the multilayer body. Deformation may occur as a result of a temperature inhomogeneity being present. By way of example, the multilayer body is curved concavely. The multilayer body rests on the base of, for example, a container. Concave deformation results in a distance between the bearing surface and the multilayer body forming in the edge region of the multilayer body. A measurement of a deformation of this type can be detected, for example, using a laser interferometry or laser light reflection device. The quantities of energy are controlled on the basis of the measurement. It is advantageous if the measurement is recognized during an early stage of the deformation and can be reacted to quickly.

For an abovementioned device for detecting a measurement of a parameter which is dependent on the annealing with the aid of an optical device (e.g. laser), it is advantageous if the layer which is to be examined is accessible to light from the optical device and a detection signal can be unambiguously assigned to the parameter which Is to be detected. The wavelength of a laser should, for example, differ sufficiently from the thermal radiation of the multilayer body. If the apparatus is equipped with a container, it would be advantageous if the transparency body is sufficiently transparent to the light of the laser.

With the aid of the apparatus, it is also possible to achieve a desired deformation of the multilayer body. For this purpose, it may also be appropriate to monitor the deformation during the annealing in the manner described above. By way of example, it is possible to produce a curved thin-film solar cell. To achieve controlled deformation, by way of example the multilayer body is laid onto a corresponding mold or mask. The mold or mask may itself be an energy source. The multilayer body is heated to above a softening point of the substrate layer. As a result, the multilayer body adopts a shape which corresponds to that of the mask or of the mold. The mask is, for example, integrated in a base of the container. The mask could, for example, be the transparency body.

A second aspect of the invention provides a process for annealing a multilayer body which has a first layer and at least one second layer, through uptake of a quantity of energy by the multilayer body involving uptake of a first partial quantity of the quantity of energy by the first layer and uptake of a second partial quantity of the quantity of energy by the second layer, at least one energy source being used to supply the quantity of energy to the multilayer body. In this process, in particular an apparatus as described above is used. The process steps comprise: arranging the multilayer body between a first energy source and at least one second energy source, so that the first layer is arranged between the first energy source and the second layer, and the second layer is arranged between the second energy source and the first layer, the energy source used being at least one energy source for providing a defined electromagnetic radiation with a radiation field, and at least one of the layers absorbing the electromagnetic radiation and being arranged in the radiation field of the energy source, and arranging a transparency body in the radiation field of the energy source between the energy source and the layer which lies in the radiation field of the energy source and absorbs the defined electromagnetic radiation, and annealing the multilayer body.

In a particular configuration, the transparency body absorbs a certain quantity of energy and supplies the quantity of energy to the layer. This takes place in particular through heat conduction and/or heat radiation from the transparency body to the layer.

In a particular configuration, at least one layer is brought into contact with a process gas. This takes place before, during and/or after the annealing. It is possible for not just one layer, but the entire multilayer body to be brought into contact with the process gas.

In a further configuration, detection of a measurement, which is dependent on the annealing, of a physical parameter of the multilayer body is carried out during the annealing, in order to control the uptake of the quantity of energy during the annealing and to control the first and second partial quantities of the quantity of energy. In a particular configuration, the transparency body supplies the quantity of energy the layer by heat conduction and/or heat radiation.

In a particular configuration, the process is carried out as a process stage in an in-line process and/or a quasi-in-line process comprising at least two process stages. Each of the process stages is carried out at a separate location (process zone). In particular, the above-described apparatus with the container is used to transport the multilayer body from process zone to process zone. The process stages may, for example, be heating zones or cooling zones, which may be equipped with coupling units in order for the vessels to be filled with gas or emptied. The process stages may be connected to one another by a surrounding processing chamber. The surrounding enclosure may, for example, be a vacuum chamber, an atmospheric pressure chamber or a high-pressure chamber. Furthermore, the process stages may be provided, at the inlet and outlet, with vacuum or high-pressure locks for the material being processed.

A further aspect of the invention provides a multilayer body, having a first layer comprising at least one substance selected from the group consisting of copper, indium, gallium, sulfur and/or selenium, and a second layer comprising glass, a lateral diameter of the multilayer body being selected from the range between 0.3 m and 5 m. The diameter is preferably over 1.0 m up to 5 m.

In a particular configuration, the multilayer body is produced by the process described above. At least one substance in the first layer of the multilayer body is selected from the group consisting of copper, indium, gallium, sulfur and selenium, and a second layer comprising glass is used. The lateral diameter (dimension) of the multilayer body is selected from the range between 0.3 m and 5 m. The layer is, for example, a copper/indium selenide semiconductor layer.

The multilayer body described is, for example, a thin-film solar cell or a thin-film solar module, which comprises a multiplicity of individual thin-film solar cells connected in series. The glass is preferably soda-lime glass. The corresponding layer functions as a substrate layer. A molybdenum layer is applied to the substrate layer as an electrode, and a functional layer, namely a copper/indium/gallium/sulfoselenide (CIGSSe) semiconductor layer, is applied on top of the molybdenum layer. A thickness of the layer body, comprising glass body and semiconductor layer, is typically 2 to 4 mm, with a molybdenum layer of approx. 0.5 $\mu$m and a semiconductor layer of approx. 3 $\mu$m. The range given for the thickness of the multilayer body is not exclusive. The limiting factor is the ability to produce a large-substrate which is as planar as possible and therefore can be processed using the apparatus described or using the process described in order to produce a multilayer body.

To summarize, the invention results in the following advantages:

A large-area multilayer body with an asymmetric layer structure (e.g. multilayer body with a single layer on a substrate layer) using a high annealing rate of over 1° C./s is possible.

The layers of the multilayer body may have a greatly varying coefficient of thermal conductivity.

Annealing takes place particularly reliably through temporal and local resolution of the detection and of the control of a measurement of a parameter which is dependent on the annealing.

Annealing is possible up to almost a softening point of a substrate layer.

Permanent deformation of the multilayer body is possible when annealing at over the softening point of the substrate layer.

The use of a container allows a defined annealing environment with a defined process-gas atmosphere to be created. In particular, a toxic and/or corrosive process gas can be used.

The process can be carried out in an in-line installation with a high throughput.

An apparatus for annealing a multilayer body and a corresponding process are presented on the basis of an exemplary embodiment and the associated figures. The figures are diagrammatic and not to scale.

DETAILED DESCRIPTION OF THE PREFERRED EMBODIMENTS

Figure 1:
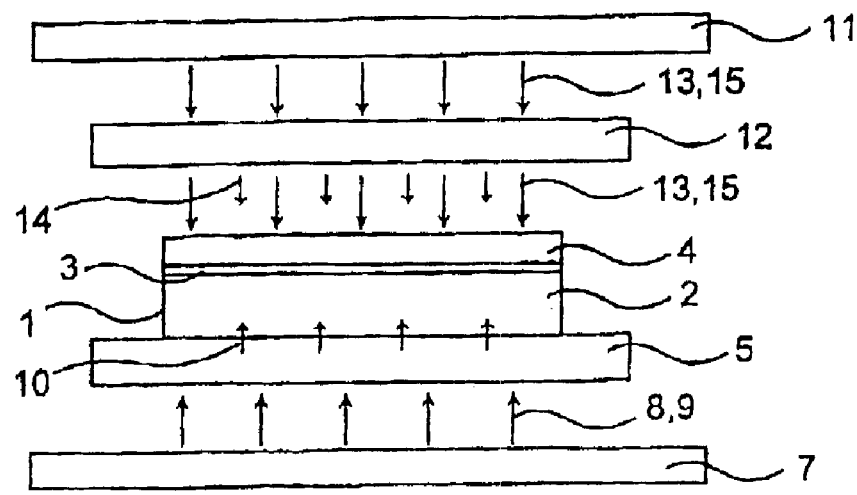
FIG. 1 shows a cross section through an apparatus for annealing a multilayer body, as seen from the side.

In the exemplary embodiments, a thin-film solar module 1 is being produced. The thin-film solar module has a basic surface area of 850×600 mm$^2$. The thickness of the solar module is 3 mm, a 0.5 $\mu$m thick layer of molybdenum 3 and a 0.5 $\mu$m thick copper/indium/gallium/sulfo-selenide (CIGSSe) semiconductor layer 4 being produced on a substrate layer comprising soda-lime glass 2.

Before the annealing, the multilayer body 1 has the following layer structure: soda-lime glass/molybdenum/copper(gallium)/indium/selenium. Soda-lime glass functions as a substrate layer 2 for the molybdenum layer 3 and the multiple layer 4. Gallium is incorporated in the copper layer. A gas mixture comprising hydrogen sulfide, helium and hydrogen is used as process gas 16. Gaseous selenium or hydrogen selenide is formed during the annealing.

Figure 4:
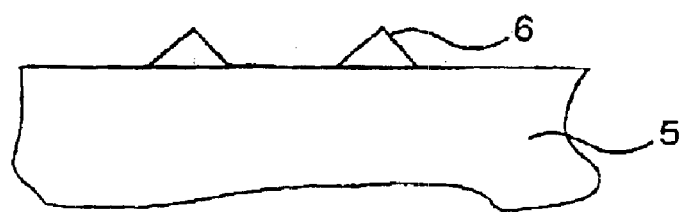
FIG. 4 shows part of a transparency body.
Figure 5A:
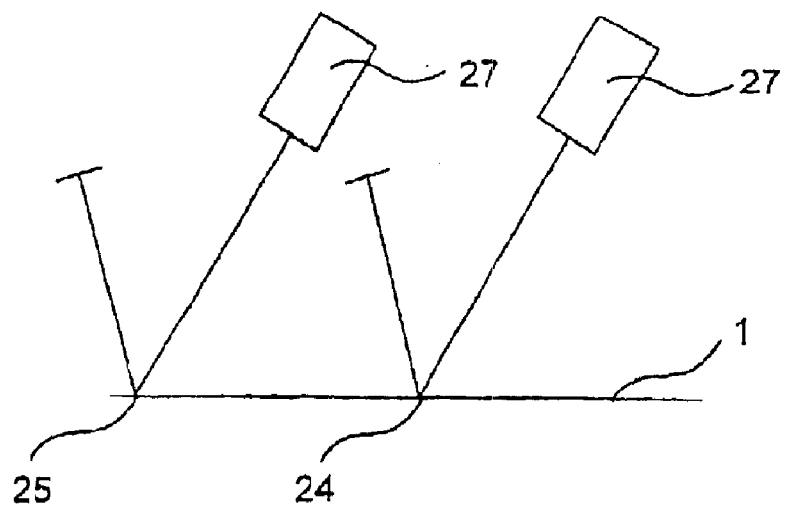
FIGS. 5a and 5b show a device for detecting the measurement of a deformation of the multilayer body.
Figure 5B:
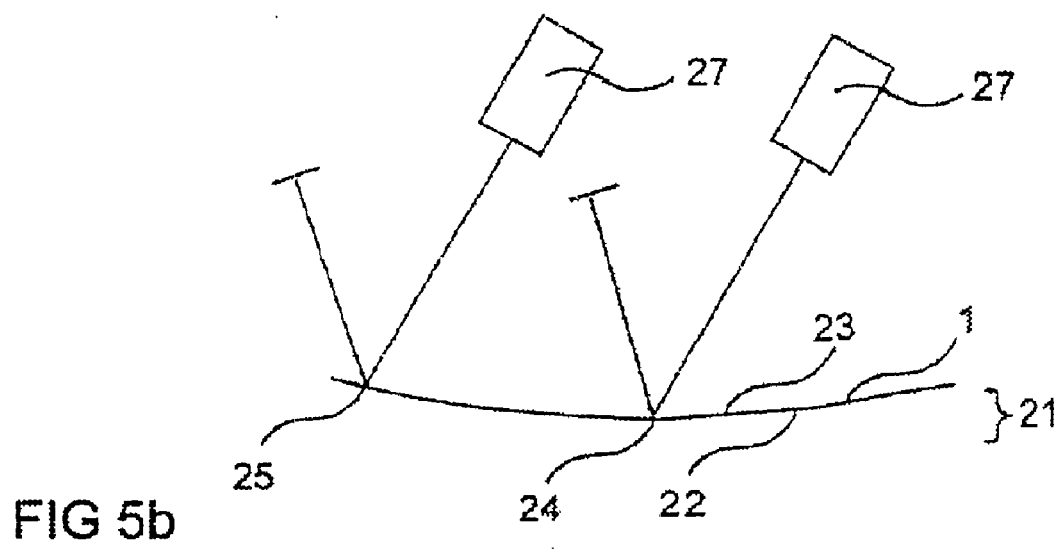

According to a first embodiment, the multilayer body is placed onto a transparency body 5 made from glass-ceramic (FIG. 1). The transparency body has a multiplicity of spacers 6 made from the same material as that which forms the transparency body 5 (FIG. 4). The transparency body 5 is situated between the substrate layer 2 of the thin-film solar module or its starting form 1 and an energy source 7. The energy source 7 comprises a plurality of arrays of halogen lamps arranged adjacent to one another to form a matrix. The matrix supplies a homogeneous radiation field 8. The transparency body 5 is situated in the radiation field 8 of the energy source 7. It absorbs some of the electromagnetic radiation 9 from the energy source and transmits the quantity of energy absorbed to the substrate layer 2 through heat conduction 10. The glass layer 2 is annealed primarily through the heat conduction 10.

A second transparency body 12 comprising glass-ceramic is arranged between a second energy source 11 and the selenium layer (outermost coating of the layer 4). The second energy source 11 is designed, just like the first energy source 7, as a matrix. The second transparency body 12 absorbs some of the electromagnetic radiation 13 from the second energy source 11. Some of the quantity of energy which is taken up in the process is released to the multiple layer 4 in the form of heat radiation 14. The transparency body 12 also transmits electromagnetic radiation 13, so that this radiation impinges on the multiple layer 4. The multiple layer 4 lies in the radiation field 15 of the energy source 11. The multiple layer 4 is annealed primarily through heat radiation 14.

Figure 2:
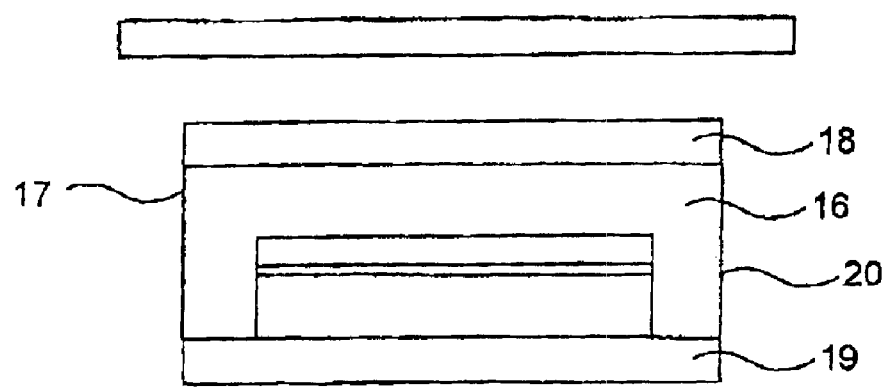
FIG. 2 shows a cross section through an apparatus for annealing having a container in which the multilayer body is arranged.

The multilayer body 1 is arranged in a container 17 in the manner described above (FIG. 2). The cover 18 and the base 19 are formed by the transparency bodies 5 and 12. A side wall 20 of the container 17 consists of carbon fiber-reinforced carbon (CFC).

Figure 6:
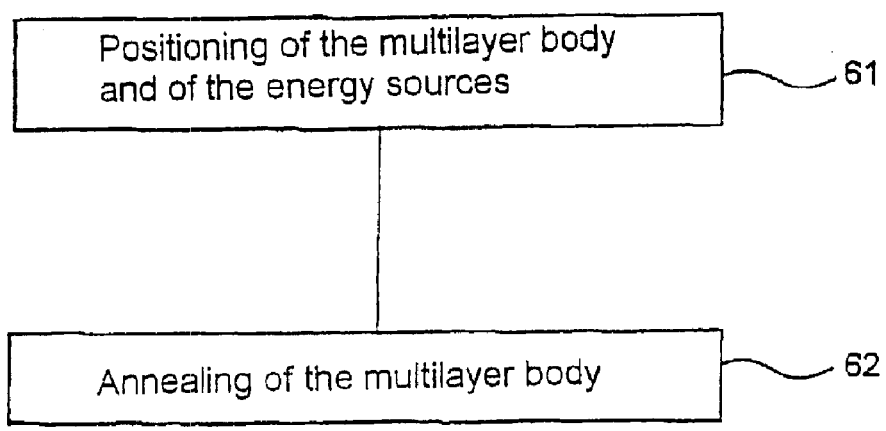
FIG. 6 shows a flowchart representing a process for annealing a multilayer body.

As set forth in FIG. 6, after the multilayer body has been laid on the baseplate at step 61, the container is filled with the process gas and closed. The annealing then takes place at step 62 at an annealing rate of 5° C./s, the energy source 7 and 11 being controlled separately.

Figure 3:
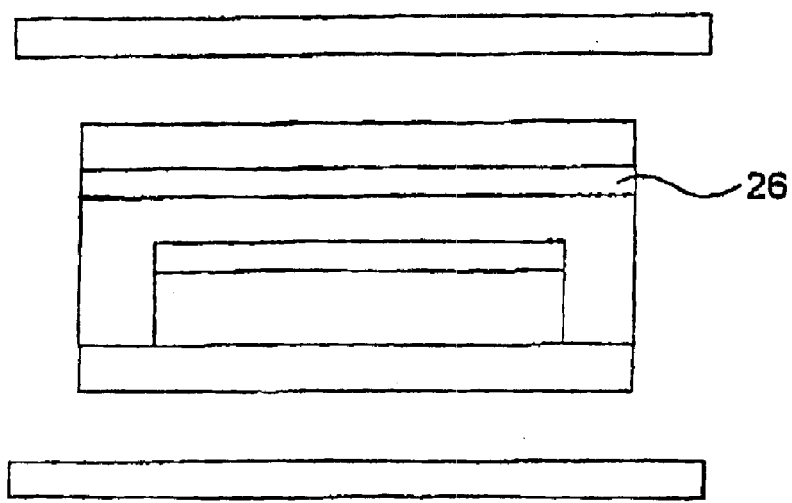
FIG. 3 shows a cross section through an annealing apparatus having a container in which the multilayer body and an energy transmitter are arranged.

A further exemplary embodiment is distinguished by the fact that an energy transmitter 26 is integrated in the box (FIG. 3).

The following control circuit is used for the energy source 7: a lateral actual temperature profile of the transparency body 5 is measured using a pyrometer in the form of an infrared sensor of suitable wavelength. The contact with the multilayer body means that the temperature profile of the substrate layer 2 can be determined from the temperature profile of the transparency body by means of calibration. A control signal, which is used to control the radiation output of the energy source 7, is determined by a control algorithm via actual and desired values of the temperature of the transparency body.

A control variable for a control circuit for controlling the energy source 11 is a transient bending 21 of the substrate layer 2. The bending 21 is measured by laser interferometry on the substrate side 22 or layer side 23. Measurement points are the substrate center 24 and a corner 25 of the multilayer body. During the laser interferometry, the change in distance caused by bending is measured and is used to determine the control signal for the associated energy source.

In a further exemplary embodiment, the control variable for the energy source 11 is the temperature of the transparency body 12.

Figure 7:
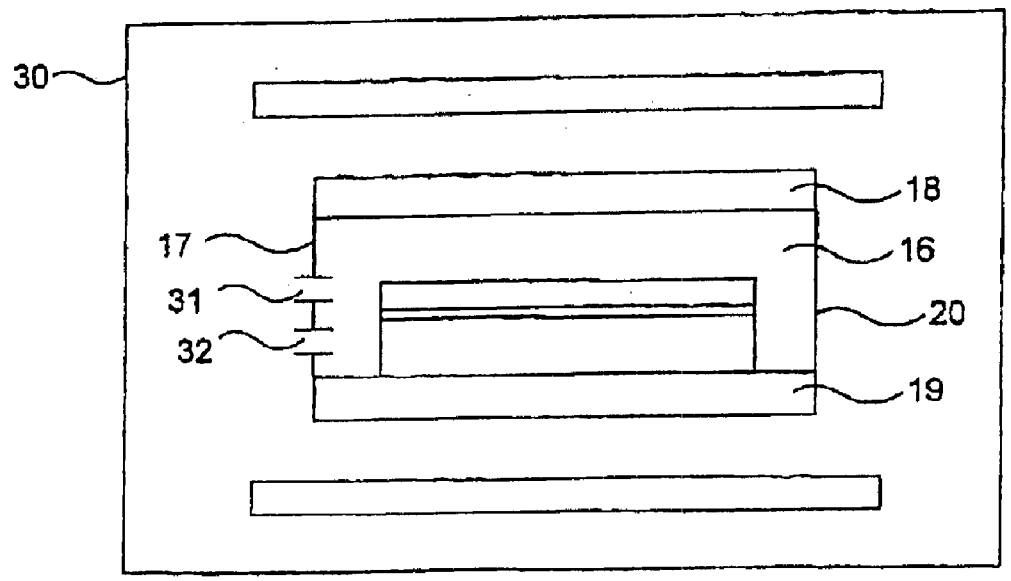
FIG. 7 shows an apparatus for annealing a multilayer body, which is arranged in a processing chamber.

A further exemplary embodiment is indicated in FIG. 7. The container 17 has gas openings in the form of a gas inlet 31 and a gas outlet 32. These openings have, for example, a closeable valve which is closed after the gas exchange has ended. While the container 17 containing the multilayer body 1 is being conveyed to the next process zone, the valve remains closed. One of the process zones is a heating zone. The heating zone comprises two arrays of halogen lamps. The annealing apparatus is produced as a result of the container (with transparency body) being conveyed into the heating zone between the two arrays.

A further exemplary embodiment is likewise indicated in FIG. 7. In this case, the entire apparatus is in a processing chamber 30, which can be evacuated and filled with a specific gas.

Figure 8A:
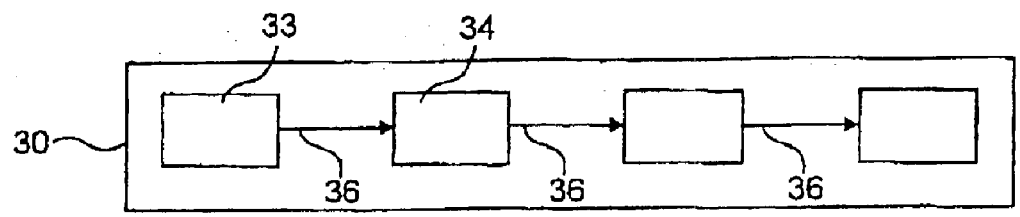
FIGS. 8a and 8b each show an in-line process.
Figure 8B:
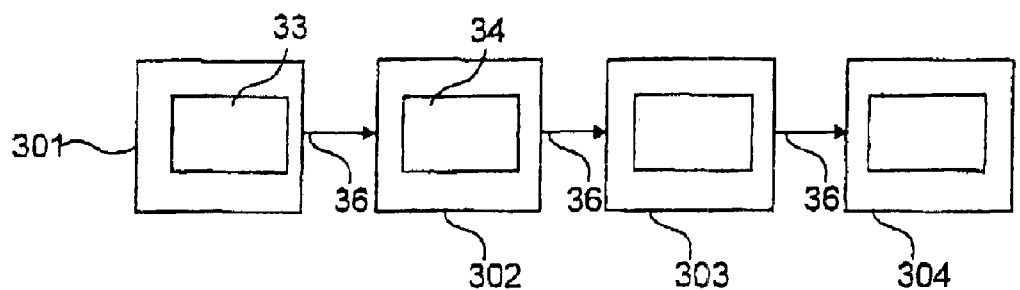

FIGS. 8a and 8b illustrate the principle of an in-line process using an in-line installation. In a first embodiment, the entire in-line installation is arranged in the processing chamber 30 (FIG. 8a). The multilayer body 1 in the container 17 is conveyed 36 from process zone 33 to process zone 34. A different process stage is carried out at each of the process zones. In process zone 33, the container 17 is filled with the process gas and heated. In process zone 34, the container 17 is evacuated and cooled. Alternatively, each of the process zones 33 and 34 is arranged in a dedicated, separate process chamber 301 to 304 (FIG. 8b). The in-line installation is divided between a plurality of process chambers. The process chambers are provided with locks, through which the containers pass into the process chambers.

Figure 9A:
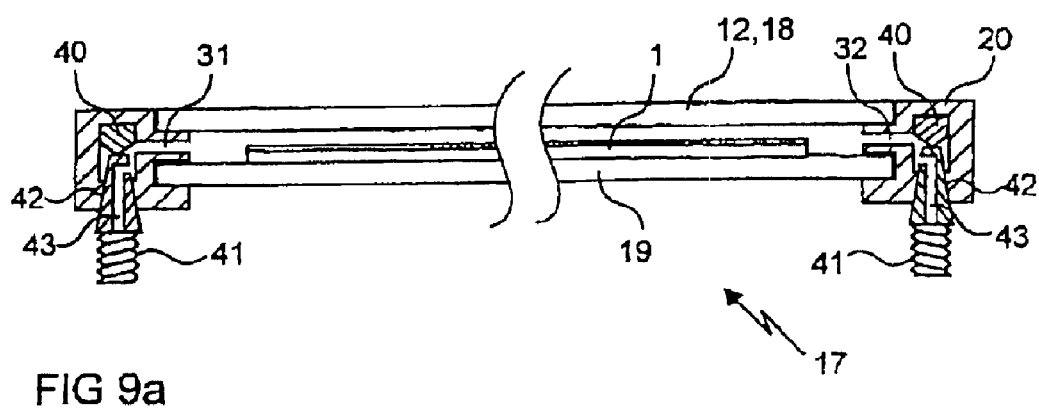
FIGS. 9a and 9b show a container with coupling unit in the processing mode and in the conveying mode.
Figure 9B:
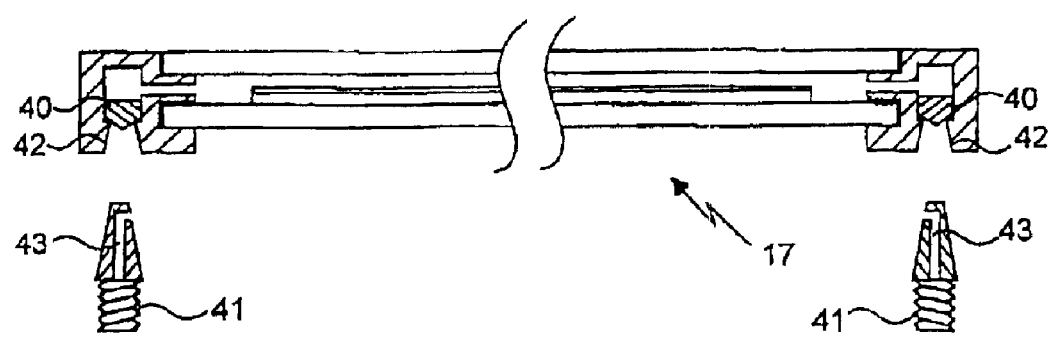

FIGS. 9a and 9b show how an arrangement for annealing or processing, including coupling unit, may be designed. FIG. 9a shows a cross section through the container 17 in processing mode. The container 17 has a cover 18 in the form of a transparency body 12. The base 19 consists of highly absorbent material. In one embodiment, the material is graphite. A side wall 20 of the container 17 is a frame of the container 17 made from CFC. Gas inlet 31 and gas outlet 32 are integrated in the side wall of the container. Self-closing valves 40 are likewise integrated in the side wall 20. These valves can be used to open and close the gas openings 31 and 32 for evacuating the container or filling the container with a gas.

A coupling unit 42 of the container of the process zone 33 is likewise integrated in the side wall. The coupling unit 42 may, for example, be designed as a conical opening. This opening is used to plug-connect the container 17 to a coupling unit 41, which is formed inversely with respect to the opening, of the process zones. Gas lines 43 are integrated in the coupling units 41 and 42. When the container has in this way been arranged with, for example, the process zone 33, by way of example any desired process gas can be introduced or discharged during this process stage, or the processing vessel can be evacuated and purged with inert gas. In the form illustrated, the coupling units 42 of the container 17 and of the process zone 33 are used to produce a process-gas atmosphere.

After the processing or annealing has ended, the coupling unit is pulled off and the valves 40 close automatically. Then, in conveying mode, the container can be conveyed to the next process zone 34. The zone 34 may, for example, be provided with a further coupling unit, which, for example, tops up consumed processing gas or introduces a new processing gas.

What is claimed is:

1. A process for annealing a multilayer body which has a first layer and at least one second layer, wherein during annealing, a quantity of energy is taken up by the multilayer body such that a first quantity of the quantity of energy is taken up by the first layer and a second quantity of the quantity of energy is taken up by the at least one second layer, wherein at least one second layer has a defined absorption for a defined electromagnetic radiation, comprising the following process steps:

a) providing an apparatus for annealing a multilayer body, which apparatus comprises an energy source comprising a first energy source and at least one second energy source emitting the defined electromagnetic radiation, and a transparency body that is semi-transparent and has a defined transmission and a defined absorption with respect to the defined electromagnetic radiation;

b) arranging the multilayer body between the first energy source and the at least one second energy source, so that the first layer is arranged between the first energy source and the at least one second layer, and the at least one second layer is arranged between the second energy source and the first layer and that the transparency body is positioned between the at least one second energy source and the at least one second layer; and c) annealing the multilayer body using the energy source to supply the quantity of energy to the multilayer body.

2. The process as claimed in claim 1, in which at least one material of one of the layers of the multilayer body is selected from the group consisting of glass, glass-ceramic, ceramic, plastic and/or metal.

3. The process as claimed in claim 1, in which, for annealing, the transparency body absorbs a defined quantity of energy, and the quantity of energy is supplied to the layer by heat conduction and/or heat radiation.

4. The process as claimed in claim 1, in which, during the annealing, a measurement, which is dependent on the annealing, of a physical parameter of the apparatus is detected in order for the uptake of the quantity of energy during the annealing to be controlled, and the quantity of energy is controlled.

5. The process as claimed in claim 1, in which at least one layer is brought into contact with a process gas.

6. The process as claimed in claim 1, which is carried out as a process stage in an in-line process and/or a quasi-inline process comprising at least two process stages.

7. The process as claimed in claim 1, in which a multilayer body is produced, comprising a first layer of at least one substance which is selected from the group consisting of copper, indium, gallium, sulfur and/or selenium, and a second layer comprising glass, a lateral diameter of the multilayer body being selected from the range between 0.3 m and 5 m.

8. The process according to claim 7, wherein the multilayer body has a lateral diameter in the range between 1.0 m and 5 m.

9. The process as claimed in claim 2, in which, for annealing, the transparency body absorbs a defined quantity of energy, and the quantity of energy is supplied to the layer by heat conduction and/or heat radiation.

10. The process as claimed in claim 2, in which, during the annealing, a measurement, which is dependent on the annealing, of a physical parameter of the apparatus is detected in order for the uptake of the quantity of energy during the annealing to be controlled, and the quantity of energy is controlled.

11. The process as claimed in claim 3, in which, during the annealing, a measurement, which is dependent on the annealing, of a physical parameter of the apparatus is detected in order for the uptake of the quantity of energy during the annealing to be controlled, and the quantity of energy is controlled.

12. The process as claimed in claim 2, in which at least one layer is brought into contact with a process gas.

13. The process as claimed in claim 2, which is carried out as a process stage in an in-line process and/or a quasi-in-line process comprising at least two process stages.

14. The process as claimed in claim 2, in which a multilayer body is produced, comprising a first layer of at least one substance which is selected from the group consisting of copper, indium, gallium, sulfur and/or selenium, and a second layer comprising glass, a lateral diameter of the multilayer body being selected from the range between 0.3 m and 5 m.

* * * * *